United States Patent [19]
Hynes

[11] Patent Number: 5,874,845
[45] Date of Patent: Feb. 23, 1999

[54] NON-OVERLAPPING CLOCK PHASE SPLITTER

[75] Inventor: Owen J. Hynes, Zumbrota, Minn.

[73] Assignee: International Business Machines Corporation, Armonk, N.Y.

[21] Appl. No.: 897,860

[22] Filed: Jul. 21, 1997

[51] Int. Cl.[6] .................................................. H03H 11/22
[52] U.S. Cl. .......................................... 327/259; 327/239
[58] Field of Search .................................... 327/239, 245, 327/247, 249, 251, 253, 257–259, 291, 295, 296; 326/93, 95–98

[56] References Cited

U.S. PATENT DOCUMENTS

| | | | |
|---|---|---|---|
| 4,761,568 | 8/1988 | Stronski | 327/259 |
| 5,047,659 | 9/1991 | Ullrich | 327/259 |
| 5,306,962 | 4/1994 | Lamb | 307/269 |
| 5,453,707 | 9/1995 | Hiratsuka et al. | 326/97 |
| 5,495,189 | 2/1996 | Choi | 326/97 |
| 5,672,991 | 9/1997 | Thoma et al. | 327/239 |
| 5,751,176 | 5/1998 | Sohn et al. | 327/295 |

OTHER PUBLICATIONS

*Non–Overlapping Clock Generator,* IBM Technical Disclosure Bulletin, by Y. Hosoya and M. Kumagai, vol. 29, No. 1, Jun., 1986, pp. 263, 264.

*Primary Examiner*—Timothy P. Callahan
*Assistant Examiner*—My-Trang Nu Ton
*Attorney, Agent, or Firm*—Lawrence D. Maxwell; Brown, Martin, Haller & McClain L.L.P.

[57] ABSTRACT

A circuit for splitting a clock signal to produce two clock signals of differing phases that do not overlap one another. The circuit includes a NFET, a first PFET, a second NFET and a second PFET. The drain terminals of the first NFET and first PFET are coupled to one another and provide a clock signal FCLKN. The source terminal of the first NFET is coupled to ground, and the source terminal of the first PFET is coupled to the power supply voltage VDD. Similarly, the drain terminals of the second NFET and second PFET are coupled to one another and provide a clock signal FCLK. The source terminal of the second NFET is coupled to ground, and the source terminal of the second PFET is coupled to VDD. The gate terminal of either the first NFET or the first PFET is coupled to a master clock signal. The gate terminal of the other is coupled to the drains of the second NFET and second PFET. Similarly, the gate terminal of the corresponding second NFET or PFET is coupled to the complement of the master clock signal. The gate terminal of the other is coupled to the drains of the first NFET and first PFET. FCLK does not overlap FCLKN because FCLKN cannot change state until FCLK has changed state, and vice versa.

10 Claims, 9 Drawing Sheets

5,874,845

NON-OVERLAPPING CLOCK PHASE SPLITTER

BACKGROUND OF THE INVENTION

1. Field of the Invention

The present invention relates to a circuit for splitting a clock signal to produce two clock signals of differing phases that do not overlap one another.

2. Description of the Related Art

Digital circuits are known that are driven by two clock signals of differing phases that do not overlap. For example, a pipeline register may be driven by such clock signals to prevent race conditions as data propagates down the register.

FIG. 1 illustrates an exemplary circuit of a type known in the art that includes a register circuit 10 driven by two clock signals FCLK and FCLKN. FIG. 2 illustrates the timing of the clock signals. Two inverters 12 and 14 in series with one another produce a clock signal FCLK that is slightly delayed in time from a master clock signal CLK. A third inverter 16 produces a clock signal FCLKN that is the complement of FCLK and slightly delayed in time from CLK. The relative delay between clock signals FCLK and FCLKN at the inputs to register circuit 10 may vary due to tolerances of the components and propagation delays. Variation in the relative delay may be substantial when multiple register circuits 10 are driven by clock signals FCLK and FCLKN, due to loading and unequal transmission line lengths. As illustrated in FIG. 2, there is a time interval 18 during which both clock signal FCLK and clock signal FCLKN are changing state. This overlap may cause race conditions and other problems in register circuit 10.

It would be desirable to provide a circuit for producing two non-overlapping clock signals that is not detrimentally affected by component tolerances or propagation delays. The foregoing, together with other features and advantages of the present invention, will become more apparent when referring to the following specification, claims, and accompanying drawings.

SUMMARY OF THE INVENTION

The present invention relates to a circuit for splitting a clock signal to produce two clock signals of differing phases that do not overlap one another. The circuit may be formed on an integrated circuit chip. The circuit includes at least four field-effect transistors (FETs): a first N-channel FET (NFET), a first P-channel FET (PFET), a second NFET and a second PFET. The drain terminals of the first NFET and first PFET are coupled to one another. The source terminal of the first NFET is coupled to a reference voltage signal representing a low logic level, such as ground. The source terminal of the first PFET is coupled to a reference voltage signal representing a high logic level, such as the power supply signal VDD of the chip. Similarly, the drain terminals of the second NFET and second PFET are coupled to one another. The source terminal of the second NFET is coupled to a reference voltage signal representing a low logic level. The source terminal of the second PFET is coupled to a reference voltage signal representing a high logic level. The gate terminal of either the first NFET or the first PFET is coupled to a master clock signal. The gate terminal of the other is coupled to the drains of the second NFET and second PFET to provide a feedback path. Similarly, the gate terminal of the corresponding second NFET or PFET is coupled to the complement of the master clock signal. The gate terminal of the other is coupled to the drains of the first NFET and first PFET to provide another feedback path.

The signal produced at the drain terminals of the second NFET and second PFET represents a clock signal FCLK. The signal produced at the drain terminals of the second NFET and second PFET represents a clock signal FCLKN that does not overlap FCLK. There is no overlap because FCLKN cannot change state until FCLK has changed state, and FCLK cannot change state until FCLKN has changed state.

The circuit may further include a delay element, such as two inverters in series with one another, in each feedback path. The delay elements increase the time between respective state transitions of FCLK and FCLKN to further ensure that the signals do not overlap.

The circuit may further include, in addition to, or alternatively to the delay elements, a third and fourth FET. The third FET may be a PFET coupled between the source terminal of the first PFET and the supply voltage, with its source terminal coupled to the supply voltage in place of the source terminal of the first PFET, and its drain terminal coupled to the source terminal of the first PFET. The fourth FET may be a PFET coupled between the source terminal of the second PFET and the supply voltage, with its source terminal coupled to the supply voltage in place of the source terminal of the second PFET, and its drain terminal coupled to the source terminal of the second PFET. Alternatively, the third FET may be a NFET coupled between the source terminal of the first NFET and ground, with its source terminal coupled to ground in place of the source terminal of the first NFET, and its drain terminal coupled to the source terminal of the first NFET. The fourth may be a NFET coupled between the source terminal of the second NFET and ground, with its source terminal coupled to ground in place of the source terminal of the second NFET, and its drain terminal coupled to the source terminal of the second NFET. The gate terminals of the third and fourth FETs are coupled to master clock signal CLK and its complement. The third and fourth FETs may be included to minimize current contention.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein.

DESCRIPTION OF PREFERRED EMBODIMENTS

Figure 3:
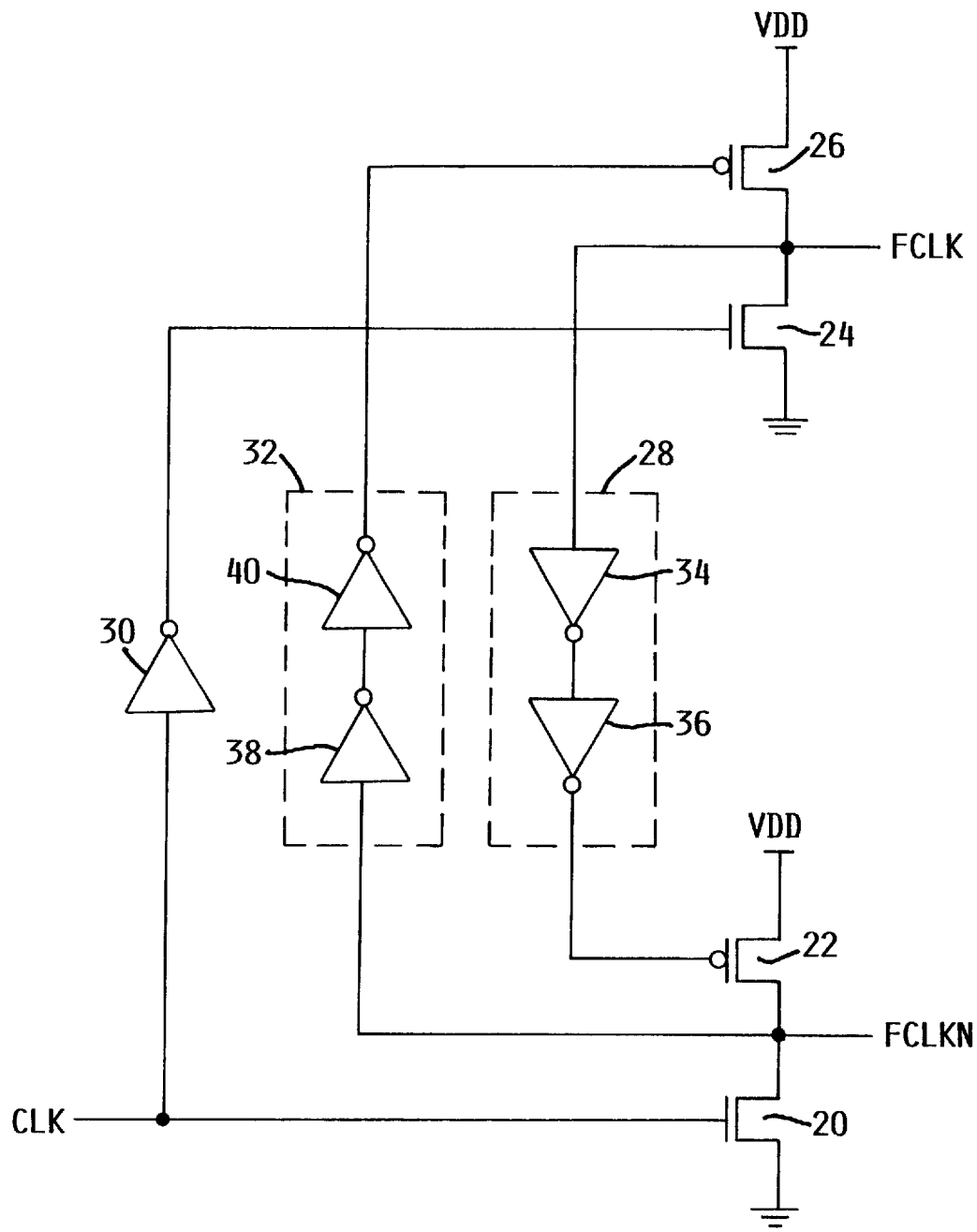
FIG. 3 illustrates a circuit of the present invention for generating non-overlapping clock signals.

FIG. 3 illustrates a circuit for generating non-overlapping clock phase signals FCLK and FCLKN in response to a master clock signal CLK. The circuit is preferably formed on an integrated circuit chip, such as a chip for controlling memory registers, as described further below. The circuit includes a first NFET 20, a first PFET 22, a second NFET 24 and a second PFET 26. The drain terminals of first NFET 20 and first PFET 22 are coupled to one another, and their signal represents clock phase signal FCLKN. The source terminal of first NFET 20 is coupled to ground. The source terminal of first PFET 22 is coupled to the power supply signal VDD of the chip. Similarly, the drain terminals of second NFET 24 and second PFET 26 are coupled to one another, and their signal represents clock phase signal FCLK. The source terminal of second NFET 24 is coupled to ground. The source terminal of second PFET 26 is coupled to power supply signal VDD. The gate terminal of first NFET 20 is coupled to master clock signal CLK. The gate terminal of first PFET 22 is coupled via a delay element 28 to the drains of second NFET 24 and second PFET 26 to provide a feedback path. Similarly, the gate terminal of the second NFET 24 is coupled to the complement of the master clock signal, which is provided by an inverter 30. The gate terminal of second PFET 26 is coupled via a delay element 32 to the drains of first NFET 20 and first PFET 22 to provide another feedback path.

Delay element 28 preferably includes two inverters 34 and 36 in series with one another. Similarly, delay element 32 preferably includes two inverters 38 and 40 in series with one another.

Figure 4:
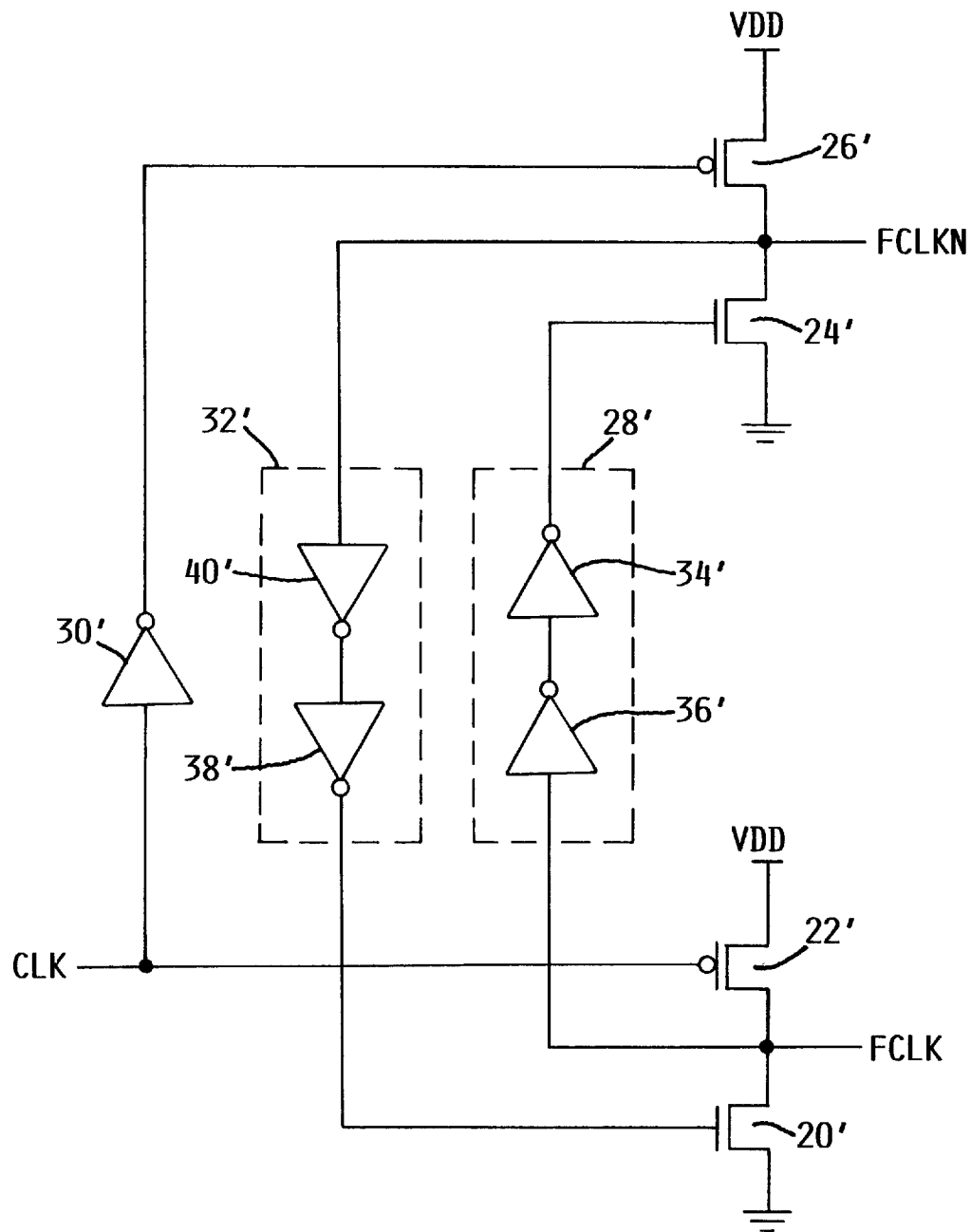
FIG. 4 illustrates an alternative circuit similar to the circuit of FIG. 3.

FIG. 4 illustrates an alternative circuit to that described above with respect to FIG. 3. The circuit includes a first NFET 20', a first PFET 22', a second NFET 24' and a second PFET 26'. The difference between this circuit and that described above with respect FIG. 3 is that master clock signal CLK and its complement are coupled to the gate terminals of first PFET 22' and second PFET 26', respectively, rather than the gate terminals of first NFET 20 and first NFET 26. Also, the feedback paths in this circuit provide signals FCLK and FCLKN to the gate terminals of second NFET 24' and first NFET 20', respectively, rather than the gate terminals of second PFET 26 and first PFET 22. As in the circuit described above, delay element 28' includes a pair of inverters 34' and 36', and delay element 32' includes a pair of inverters 38' and 40'. Another inverter 30' provides the complement of master clock signal CLK.

In the circuits described above, it should be noted that each of inverters 30, 34, 36, 38 and 40 (FIG. 3) and inverters 30', 34', 36', 38' and 40' (FIG. 4) may be formed using a NFET and a PFET arranged in the manner well-known in the art. Nevertheless, inverters 30, 34, 36, 38 and 40 are illustrated in FIG. 3 and inverters 30', 34', 36', 38' and 40' are illustrated in FIG. 4 using the logic symbol for an inverter rather than FET symbols for purposes of clarity.

In the circuits described above, it should further be noted that, although the gate terminal of one of the first FETs is illustrated as being coupled to the master clock CLK, and the gate terminal of the corresponding second FET is illustrated as being coupled to the complement of the master clock CLK, the reverse would also be suitable. In other words, the gate terminal of one of the second FETs may alternatively be coupled to the master clock CLK, and the gate terminal of the corresponding first FET may be coupled to the complement of the master clock.

Figure 1:
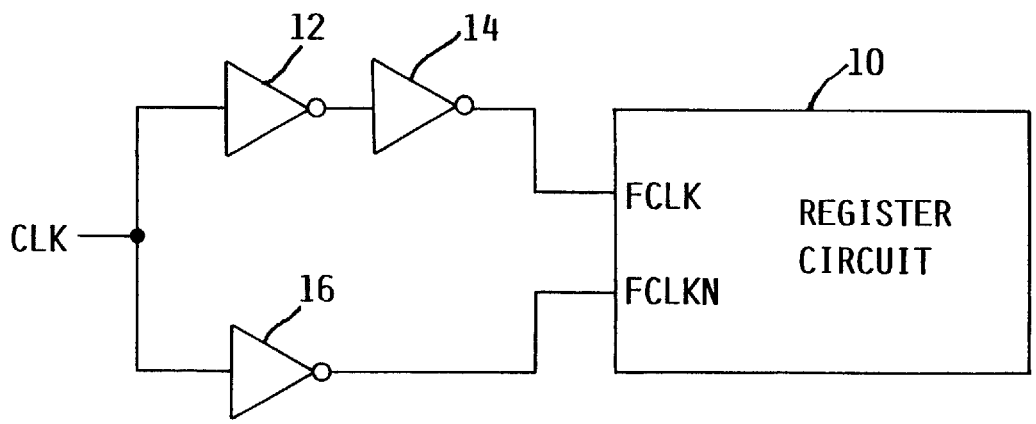
FIG. 1 illustrates a prior circuit for generating clock signals.
Figure 2:
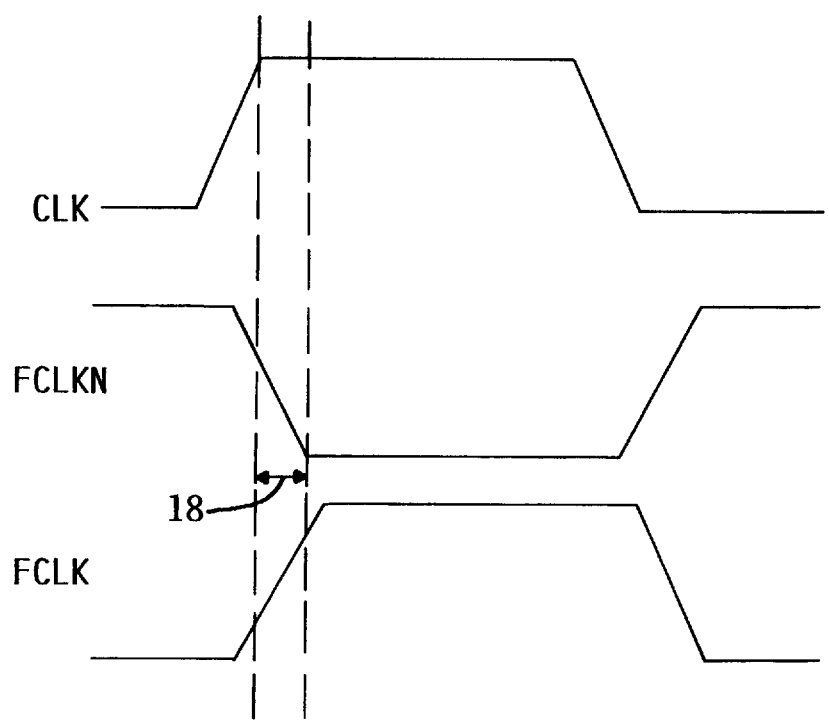
FIG. 2 is a timing diagram for the circuit of FIG. 1.

An interesting advantage of the circuits illustrated in FIGS. 3 and 4 is that they may be formed using the same number of FETs as used in the prior clock splitter circuit illustrated in FIG. 1. Each of inverters 12, 14 and 16 in the circuit illustrated in FIG. 1 is formed using a NFET and a PFET arranged in the well-known manner. In modifying an existing or legacy integrated circuit chip design having such a clock splitter circuit, the six legacy FETs may be reconnected in a manner that embodies the present invention without increasing the real-estate that the circuit occupies on the chip. For example, with respect to FIG. 3, one legacy NFET and legacy PFET may be reconnected as first NFET 20 and first PFET 22, respectively; another legacy NFET and legacy PFET may be reconnected as second NFET 24 and second PFET 26, respectively; and the remaining legacy NFET and legacy PFET may be reconnected to form inverter 30.

Figure 5:
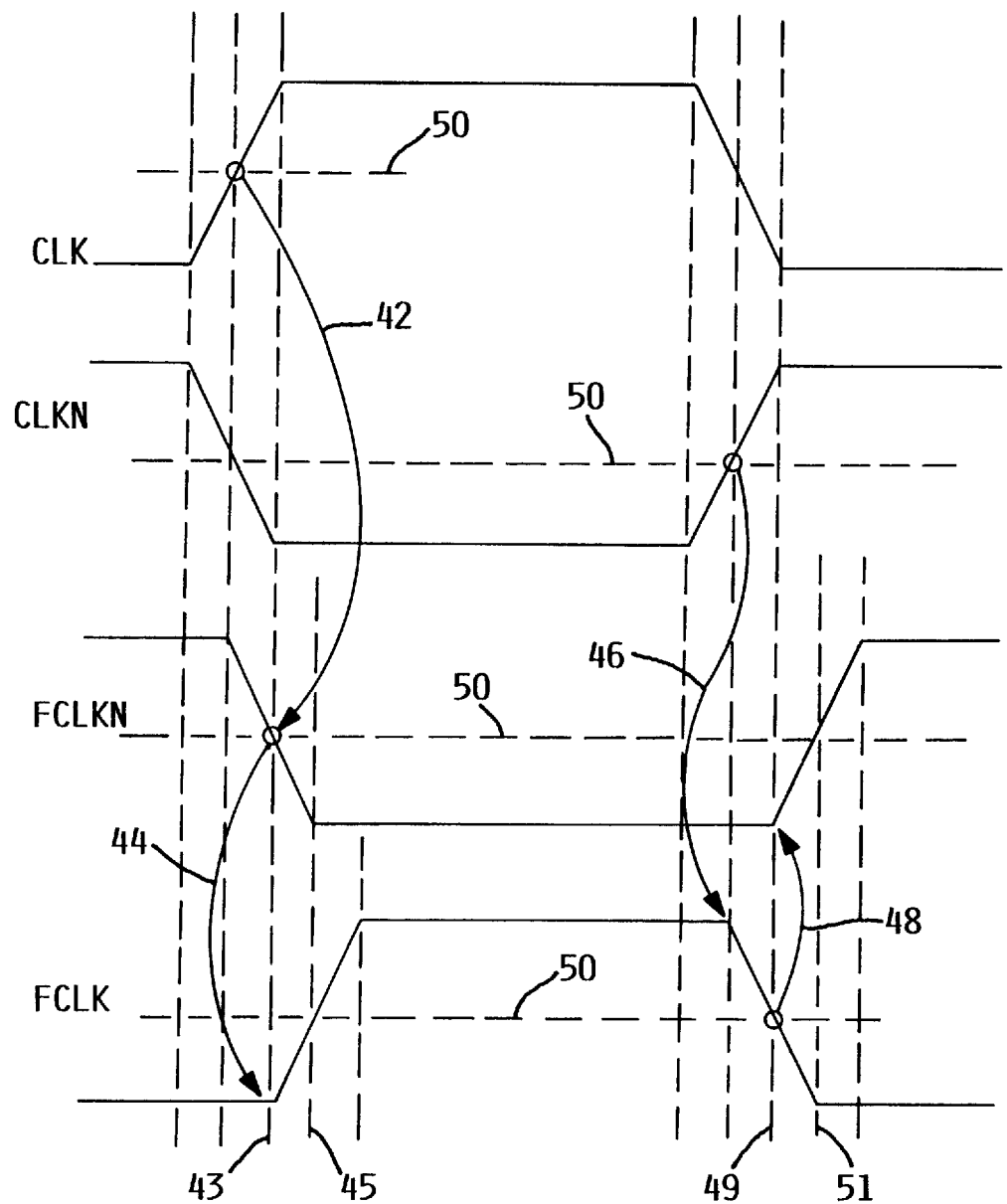
FIG. 5 is a timing diagram for the circuits of FIGS. 3 and 4.

In the circuits illustrated in FIGS. 3 and 4, clock phase signals FCLK and FCLKN do not overlap to any significant extent because, following the rising edge of CLK, FCLK cannot change state until FCLKN has changed state and, following the falling edge of CLK, FCLKN cannot change state until FCLK has changed state. The timing for the circuit illustrated in FIG. 3, for example, is illustrated in FIG. 5. (The timing for the circuit illustrated in FIG. 4 is similar and is thus not separately illustrated.) The rising edge of the master clock signal CLK turns first NFET 20 on, which causes FCLKN to fall, as indicated by the arrow 42. The falling edge of FCLKN, in turn, turns second PFET 26 on, which causes FCLK to rise, as indicated by the arrow 44. Although FCLK and FCLKN are both in transition, i.e., they overlap, during the time interval between time 43 and time 45, the voltages of FCLK and FCLKN during this interval are well below the switching voltage threshold 50, which is approximately 0.7 volts. The overlap is thus insignificant because the voltages of FCLK and FCLKN are too low to switch the FETs to which they are fed back. The signals remain stable until the master clock signal CLK again changes state. The rising edge of its complement CLKN turns second NFET 24 on, which causes FCLK to fall, as indicated by the arrow 46. The falling edge of FCLK, in turn, turns first PFET 22 on, which causes FCLKN to rise, as indicated by the arrow 48. Again, although FCLK and FCLKN overlap somewhat during the time interval between time 49 and time 51, the overlap is insignificant because the voltages of FCLK and FCLKN are too low to switch the FETs to which they are fed back.

It may be observed that immediately following each rising edge of CLK, first NFET and PFET 20 and 22 appear to both be on, and second NFET and PFET 24 and 26 appear to both be off. Similarly, immediately following each falling edge of CLK, first NFET and PFET 20 and 22 appear to both be off, and second NFET and PFET 24 and 26 appear to both be on. First NFET and PFET 20 and 22 thus appear to be in contention with each other, as do second NFET and PFET 24 and 26. This contention is generally not significant, however, for two reasons. First, it should be noted that the threshold on and off states are only defined for the purpose of convenience. In other words, although the origins of arrows 42, 44, 46 and 48 in the timing diagram illustrate that switching occurs exactly at switching voltage threshold 50, the drain-to-source voltage of each FET actually begins changing when the gate-to-source voltage begins changing. Thus, the switching is more continuous and less discrete than the timing diagram, which is simplified and not to scale for purposes of clarity, may suggest. Second, it should be noted that a NFET can sink approximately 2.5 times the current than a PFET of the same physical dimensions can source. Thus, first NFET 20 quickly wins the contention between it and first PFET 22, and second NFET 24 quickly wins the contention between it and second PFET 26. When the master clock signal CLK has a frequency on the order of 100 megahertz (MHZ), as is typical in many computer circuits, and propagation delays and loading are not excessive, the contention does not cause any problem.

Figure 6:
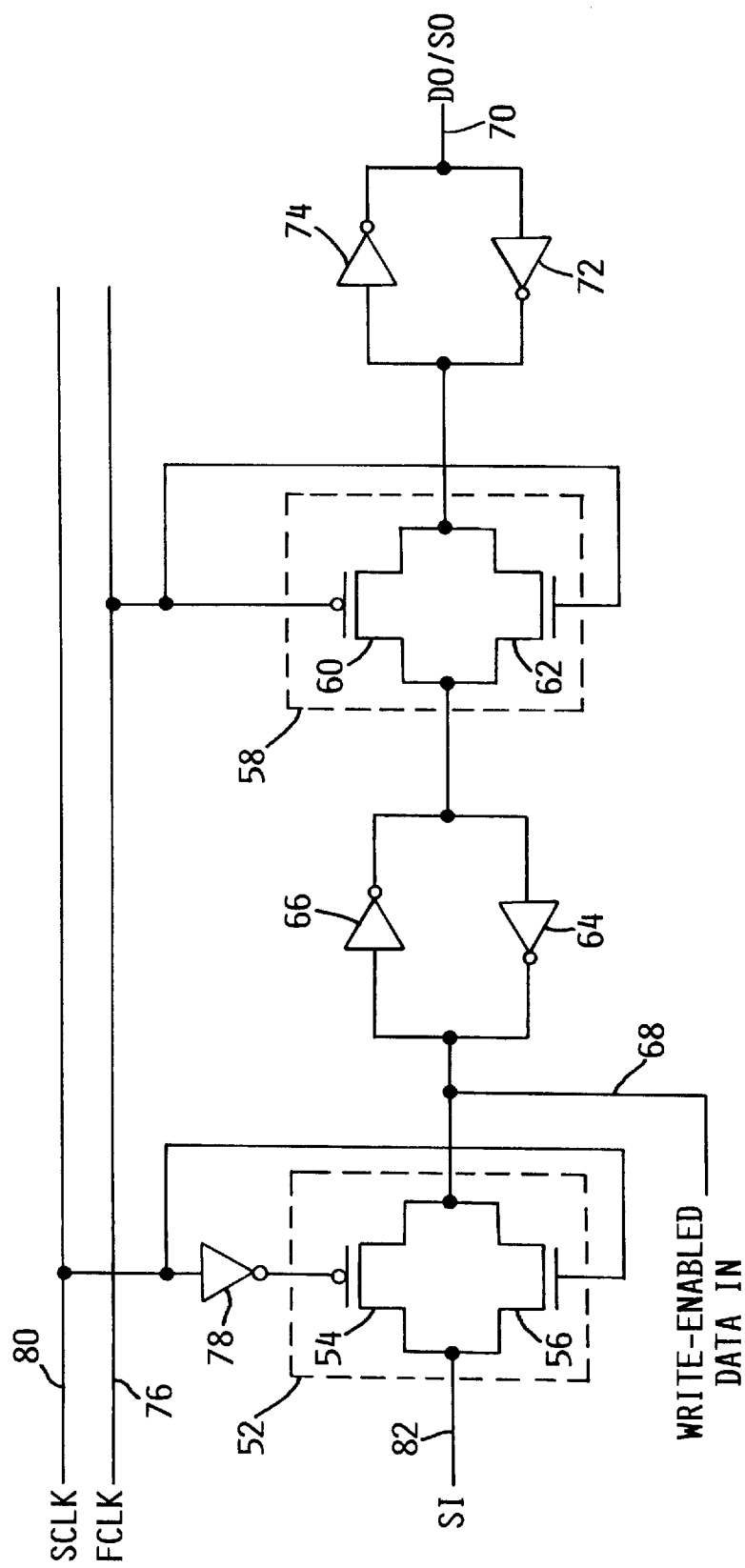
FIG. 6 illustrates a latch cell of a memory register that the circuits of the present invention may drive.

The circuits illustrated in FIGS. 3 and 4 may be used to drive various types of circuits. FIG. 6 illustrates one such circuit, which is a cell of a general-purpose memory register for a computer. The cell includes a pass gate 52 that includes a pair of FETs 54 and 56, and a pass gate 58 that includes another pair of FETs 60 and 62. A bidirectional buffer having two inverters 64 and 66 is disposed between pass gates 52 and 58. The cell receives a write-enabled data signal 68 that initiates storage of a data bit in the cell. The cell provides a data-out/scan-out (DO/SO) signal 70 that presents data read from the cell. Another bidirectional buffer having two inverters 72 and 74 is disposed between pass gate 58 and DO/SO signal 70. The cell receives a free-running clock signal (FCLK) 76, which may be the FCLK signal generated by the circuit of FIG. 3 or FIG. 4. Free-running clock signal 76 is provided to pass gate 52 via an inverter 78. The circuit of FIG. 6 also receives a scan clock signal (SCLK) 80 that occurs only during a scan mode and has a phase opposite of that of FCLK. Scan clock signal 80 is provided to pass gate 58.

Figure 7:
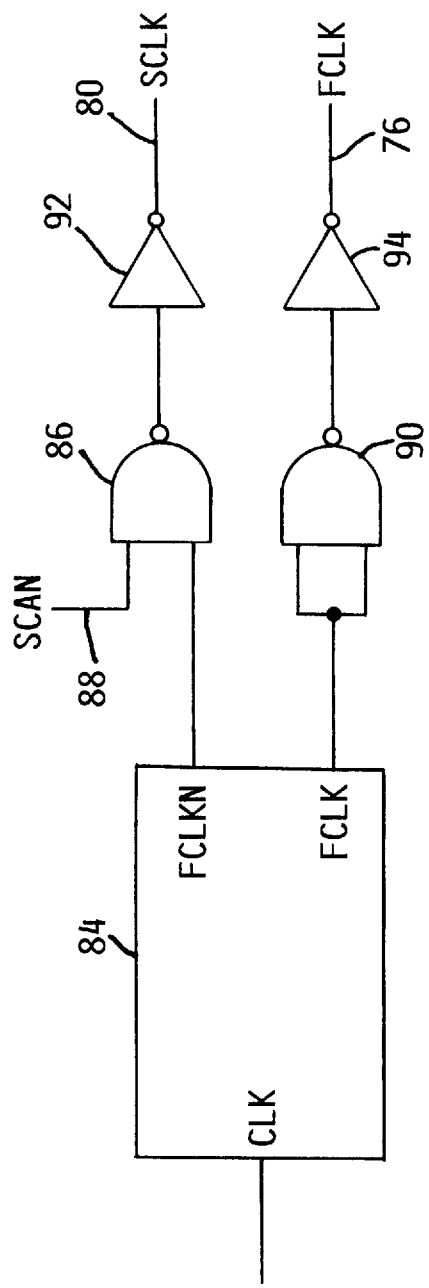
FIG. 7 illustrates a circuit for driving the latch cell of FIG. 6.

As illustrated in FIG. 7, the non-overlapping clock generator circuit 84 (which may be the circuit of FIG. 3 or FIG. 4) provides the FCLKN signal to a NOR gate 86 that is enabled when scan mode is indicated by a scan signal 88. The FCLK signal is provided to a similar NOR gate 90 to equalize the propagation delay. The outputs of NOR gates 86 and 90 are provided to inverters 92 and 94, respectively. The output of inverter 92 is scan clock signal 80, and the output of inverter 94 is free-running clock signal 76.

Although the exact nature of the operation of this circuit is not relevant to the present invention, it may briefly be noted that the scan mode is used to test the memory register following its manufacture or at other times. A pattern of test data is provided by a scan-in (SI) signal 82. The cell stores the test data in response to scan-clock signal 80. The test data retrieved from the cell is presented via DO/SO signal 70. In this manner, a pattern of test data may be sequentially stored in and retrieved from a memory register comprising many such cells in a manner much faster than if the cells were addressed individually using write-enabled data signal 68 as they are during normal operation in the computer.

A problem could occur if free-running clock signal 76 and scan clock signal 80 were to overlap. Data provided via scan-in signal 82 would pass through both pass gates 52 and 58 and would not be stored. The present invention inhibits such overlap.

Providing non-overlapping clock signals to many register cells, such as the cell illustrated in FIG. 6, may result in differences in the relative delay between free-running clock signal 76 and scan clock signal 80 at the various cells, due to propagation delays and loading. A typical computer memory register may include hundreds of such cells, and free-running clock signal 76 and clock signal 80 may be routed to the cells along paths of varying lengths. Delay elements 28 and 32 (FIG. 3) and 28' and 32' (FIG. 4) inhibit the occurrence of problems that may otherwise be caused by such delay differences. The occurrence of such problems may further be inhibited by minimizing the current contention discussed above with respect to FIGS. 3 and 4.

Figure 8:
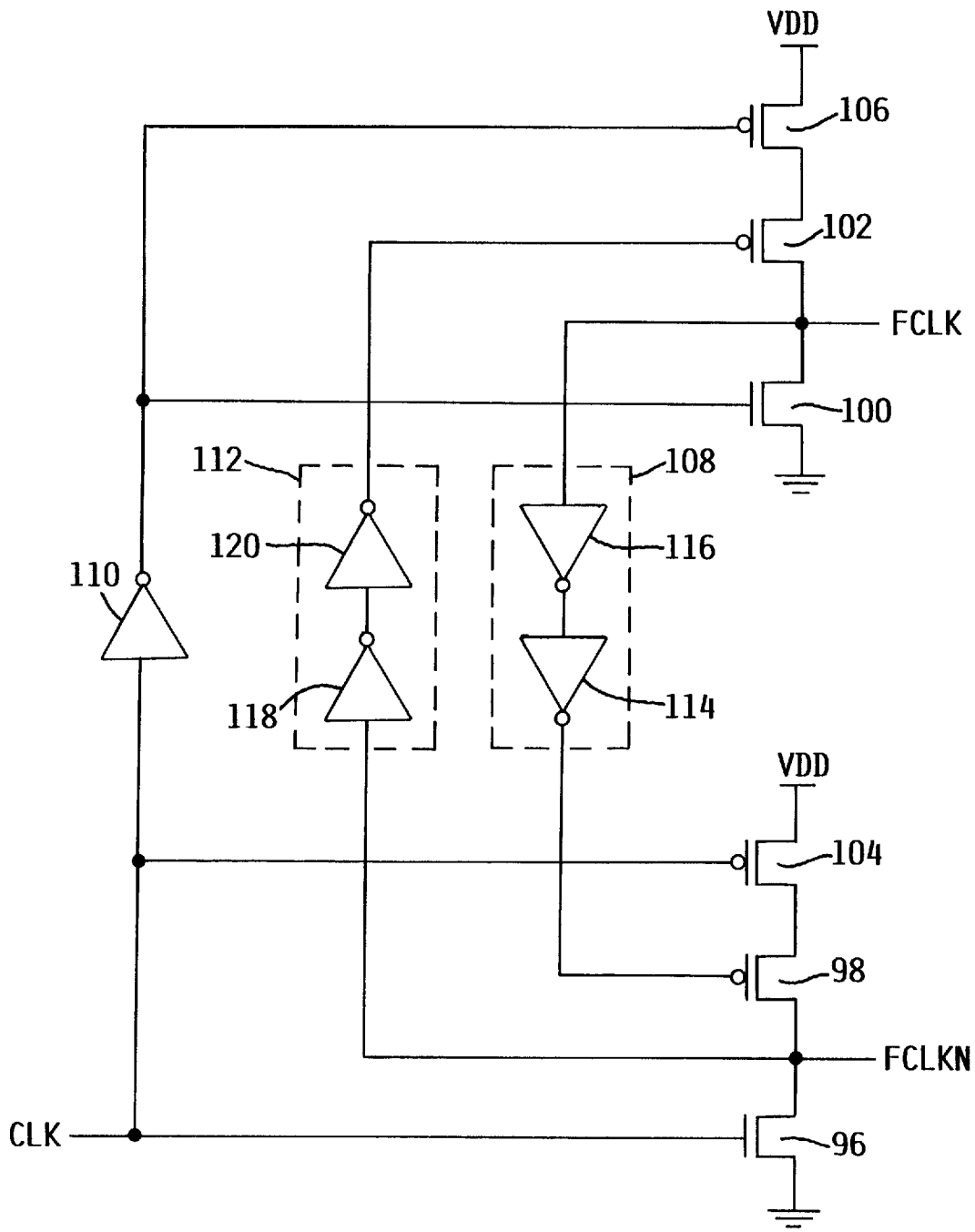
FIG. 8 illustrates another alternative circuit of the present invention for generating non-overlapping clock signals.

FIG. 8 illustrates a circuit that is similar to FIG. 3 but that minimizes the current contention that occurs following a transition of the master clock signal CLK. The circuit includes a first NFET 96, a first PFET 98, a second NFET 100 and a second PFET 102. As in FIG. 3, the drain terminals of first NFET 100 and first PFET 102 are coupled to one another, and their signal represents clock phase signal FCLKN. The source terminal of first NFET 100 is coupled to ground. Unlike the circuit of FIG. 3, however, the source terminal of first PFET 98 is coupled to the drain terminal of a third PFET 104. The source terminal of third PFET 104 is coupled to the power supply signal VDD. Similarly, the drain terminals of second NFET 100 and second PFET 102 are coupled to one another, and their signal represents clock phase signal FCLK. The source terminal of second NFET 100 is coupled to ground. Again, unlike the circuit of FIG. 3, the source terminal of second PFET 102 is coupled to the drain terminal of a fourth PFET 106. The source terminal of fourth PFET 106 is coupled to power supply signal VDD. The gate terminal of first NFET 20 is coupled to master clock signal CLK as well as to the gate terminal of third PFET 106. The gate terminal of first PFET 98 is coupled via a delay element 108 to the drains of second NFET 100 and second PFET 102 to provide a feedback path. Similarly, the gate terminal of the second NFET 100 is coupled to the complement of the master clock signal, which is provided by an inverter 110, as well as to the gate terminal of fourth PFET 106. The gate terminal of second PFET 102 is coupled via a delay element 112 to the drains of first NFET 96 and first PFET 98 to provide the other feedback path. As in the circuit of FIG. 3, delay elements 108 and 112 include inverters 114, 116, 118 and 120.

Figure 9:
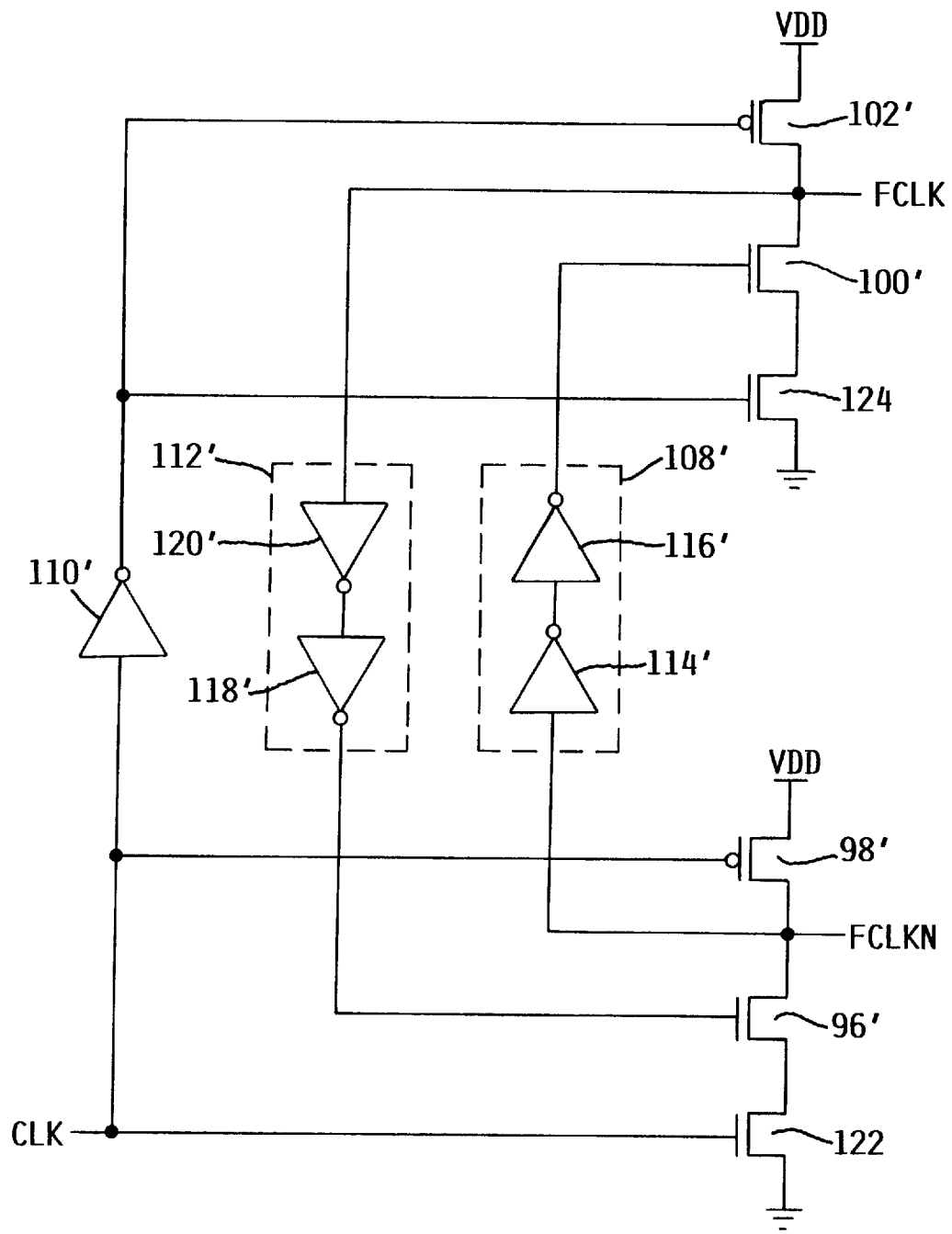
FIG. 9 illustrates still another alternative circuit similar to the circuit of FIG. 8.

FIG. 9 illustrates an alternative circuit similar to FIG. 4 but that minimizes the current contention that occurs following a transition of the master clock signal CLK. The circuit is similar to FIG. 8 in that it includes two additional FETs for this purpose. The circuit includes a first NFET 96', a first PFET 98', a second NFET 100' and a second PFET 102'. Master clock signal CLK is coupled to the gate terminal of first PFET 98' as well as to the gate terminal of a third NFET 122. The complement of master clock signal CLK, which is provided by an inverter 110', is coupled to the gate terminal of second PFET 102' as well as to the gate terminal of a fourth NFET 124. As in FIG. 4, the feedback paths provide signals FCLK and FCLKN to the gate terminals of second NFET 100' and first NFET 96', respectively. As in all of the circuits described above, delay elements 108' and 112' include inverters 114', 116', 118' and 120'.

Other embodiments and modifications of the present invention will occur readily to those of ordinary skill in the art in view of these teachings. Such persons will appreciate the symmetries among the various embodiments illustrated above and understand that their elements may be arranged in other ways to produce similar results. For example, the symmetry between FIGS. 3 and 4 and between FIGS. 8 and 9 is intended to illustrate that in many cases PFETs may be reversed with NFETs in a circuit without departing from the scope of the invention. Similarly, signals and their complements may be inverted from the designations in the illustrated embodiments without departing from the scope of the invention. Therefore, this invention is to be limited only by the following claims, which include all such other embodiments and modifications when viewed in conjunction with the above specification and accompanying drawings.

What is claimed is:

1. A circuit for generating non-overlapping first and second clock phase signals in response to a clock signal, comprising:

a first N-channel FET (NFET) having a gate terminal, a source terminal, and a drain terminal, said source terminal of said first NFET coupled to a reference voltage signal representing a low logic level;

a first P-channel field-effect transistor (PFET) having a gate terminal, a source terminal, and a drain terminal, said source terminal of said first PFET coupled to a reference voltage signal representing a high logic level, and said drain terminal of said first NFET coupled to said drain terminal of said first PFET;

a second NFET having a gate terminal, a source terminal, and a drain terminal, said source terminal of said second NFET coupled to a reference voltage signal representing a low logic level;

a second PFET having a gate terminal, a source terminal, and a drain terminal, said source terminal of said second PFET coupled to a reference voltage signal representing a high logic level, and said drain terminal of said second NFET coupled to said drain terminal of said second PFET;

said gate terminal of said first NFET coupled to said clock signal, and said gate terminal of said second NFET coupled to a complement of said clock signal, said gate terminals of said first NFET and said first PFET not coupled to each other; and said gate terminal of said first PFET coupled to said drain terminal of said second PFET and said drain terminal of said second NFET for providing a first clock phase signal, and said gate terminal of said second PFET coupled to said drain terminal of said first PFET and said drain terminal of said first NFET for providing a second clock phase signal, said gate terminals of said second NFET and said second PFET not coupled to each other.

2. The circuit recited in claim 1, further comprising:

a first delay element having an input coupled to said drain terminals of said first NFET and first PFET and an output coupled to said gate terminal of said second PFET;

a second delay element having an input coupled to said drain terminals of said second NFET and second PFET and an output coupled to said gate terminal of said first PFET.

3. The circuit recited in claim 2, wherein said first and second delay elements each comprise a pair of inverters.

4. The circuit recited in claim 1, further comprising:

a third PFET having a drain terminal coupled to said source terminal of said first PFET, a source terminal coupled to said reference voltage signal representing a high logic level, and a gate terminal coupled to said gate terminal of said first NFET; and a fourth PFET having a drain terminal coupled to said source terminal of said second PFET, a source terminal coupled to said reference voltage signal representing a high logic level, and a gate terminal coupled to said gate terminal of said second NFET.

5. A circuit for generating non-overlapping first and second clock phase signals in response to a clock signal, comprising:

a first N-channel FET (NFET) having a gate terminal, a source terminal, and a drain terminal, said source terminal of said first NFET coupled to a reference voltage signal representing a low logic level;

a first P-channel field-effect transistor (PFET) having a gate terminal, a source terminal, and a drain terminal,
said source terminal of said first PFET coupled to a reference voltage signal representing a high logic level, and said drain terminal of said first NFET coupled to said drain terminal of said first PFET;

a second NFET having a gate terminal, a source terminal, and a drain terminal, said source terminal of said second NFET coupled to a reference voltage signal representing a low logic level;

a second PFET having a gate terminal, a source terminal, and a drain terminal, said drain terminal of said second NFET coupled to said drain terminal of said second PFET;

a third PFET having a drain terminal coupled to said source terminal of said first PFET, a source terminal coupled to a reference voltage signal representing a high logic level, and a gate terminal coupled to said gate terminal of said first NFET;

a fourth PFET having a drain terminal coupled to said source terminal of said second PFET, a source terminal coupled to said reference voltage signal representing a high logic level, and a gate terminal coupled to said gate terminal of said second NFET;

said gate terminal of said first NFET coupled to said clock signal, and said gate terminal of said second NFET coupled to a complement of said clock signal;

a first pair of inverters coupled in series with one another to define a first delay element, said first delay element having an input coupled to said drain terminals of said first NFET and first PFET and an output coupled to said gate terminal of said second PFET, said drain terminals of said first NFET and first PFET providing a first clock phase signal; and a second pair of inverters coupled in series with one another to define a second delay element, said second delay element having an input coupled to said drain terminals of said second NFET and second PFET and an output coupled to said gate terminal of said first PFET, said drain terminals of said second NFET and second PFET providing a second clock phase signal.

6. A circuit for generating non-overlapping first and second clock phase signals in response to a clock signal, comprising:

a first N-channel FET (NFET) having a gate terminal, a source terminal, and a drain terminal, said source terminal of said first NFET coupled to a reference voltage signal representing a low logic level;

a first P-channel field-effect transistor (PFET) having a gate terminal, a source terminal, and a drain terminal, said source terminal of said first PFET coupled to a reference voltage signal representing a high logic level, and said drain terminal of said first NFET coupled to said drain terminal of said first PFET;

a second NFET having a gate terminal, a source terminal, and a drain terminal, said source terminal of said second NFET coupled to a reference voltage signal representing a low logic level;

a second PFET having a gate terminal, a source terminal, and a drain terminal, said source terminal of said second PFET coupled to a reference voltage signal representing a high logic level, and said drain terminal of said second NFET coupled to said drain terminal of said second PFET;

said gate of said first PFET coupled to said clock signal, and said gate of said second PFET coupled to a complement of said clock signal, said gate terminals of said first NFET and said first PFET not coupled to each other; and said gate terminal of said first NFET coupled to said drain of said second PFET and said drain of said second NFET for providing a first clock phase signal, and said gate terminal of said second NFET coupled to said drain terminal of said first PFET and said drain terminal of said first NFET for providing a second clock phase signal, said gate terminals of said second NFET and said second PFET not coupled to each other.

7. The circuit recited in claim 6, further comprising:

a first delay element having an input coupled to said drain terminals of said first NFET and first PFET and an output coupled to said gate terminal of said second NFET;

a second delay element having an input coupled to said drain terminals of said second NFET and second PFET and an output coupled to said gate terminal of said first NFET.

8. The circuit recited in claim 7, wherein said first and second delay elements each comprise a pair of inverters.

9. The circuit recited in claim 6, further comprising:

a third NFET having a drain terminal coupled to said source terminal of said first NFET, a source terminal coupled to said reference voltage signal representing a low logic level, and a gate terminal coupled to said gate terminal of said first PFET; and a fourth NFET having a drain terminal coupled to said source terminal of said second NFET, a source terminal coupled to said reference voltage signal representing a low logic level, and a gate terminal coupled to said gate terminal of said second PFET.

10. A circuit for generating non-overlapping first and second clock phase signals in response to a clock signal, comprising:

a first N-channel FET (NFET) having a gate terminal, a source terminal, and a drain terminal;

a first P-channel field-effect transistor (PFET) having a gate terminal, a source terminal, and a drain terminal, said source terminal of said first PFET coupled to a reference voltage signal representing a high logic level, and said drain terminal of said first NFET coupled to said drain terminal of said first PFET;

a third NFET having a drain terminal coupled to said source terminal of said first NFET, a source terminal coupled to a reference voltage signal representing a low logic level, and a gate terminal coupled to said gate terminal of said first PFET;

a second NFET having a gate terminal, a source terminal, and a drain terminal;

a second PFET having a gate terminal, a source terminal, and a drain terminal, said source terminal of said second PFET coupled to a reference voltage signal representing a high logic level, and said drain terminal of said second NFET coupled to said drain terminal of said second PFET;

a fourth NFET having a drain terminal coupled to said source terminal of said second NFET, a source terminal coupled to said reference voltage signal representing a low logic level, and a gate terminal coupled to said gate terminal of said second PFET;

said gate of said first PFET coupled to said clock signal, and said gate of said second PFET coupled to a complement of said clock signal; and a first pair of inverters coupled in series with one another to define a first delay element, said first delay element having an input coupled to said drain terminals of said first NFET and first PFET and an output coupled to said gate terminal of said second NFET, said drain terminals of said first NFET and first PFET providing a first clock phase signal; and a second pair of inverters coupled in series with one another to define a second delay element, said second delay element having an input coupled to said drain terminals of said second NFET and second PFET and an output coupled to said gate terminal of said first NFET, said drain terminals of said second NFET and second PFET providing a second clock phase signal.

* * * * *